United States Patent
Nuebling et al.

(10) Patent No.: US 12,132,475 B1
(45) Date of Patent: Oct. 29, 2024

(54) GATE DRIVER CIRCUIT FOR CURRENT CONTROLLED SWITCHING ELEMENT

(71) Applicant: Infineon Technologies AG, Neubiberg (DE)

(72) Inventors: Marcus Nuebling, Olching-Esting (DE); Peter Weiß, Kelheim (DE); Christoph Bauer, Regensburg (DE); Christian Novak, Remseck am Neckar (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 18/448,702

(22) Filed: Aug. 11, 2023

(51) Int. Cl.
  H03K 17/296 (2006.01)
(52) U.S. Cl.
  CPC .................. H03K 17/296 (2013.01)
(58) Field of Classification Search
  CPC ..................................... H03K 17/296
  USPC ........................................... 327/109
  See application file for complete search history.

(56) References Cited

U.S. PATENT DOCUMENTS 11,867,762 B1 * 1/2024 Nuebling ................ H02M 1/08

OTHER PUBLICATIONS

Datasheet et al., "CoolGaN Integrated Power Stage (IPS) IGI60F1414A1L", infineon, Nov. 25, 2022, 34 pp.
"600V CoolGaN™ enhancement-mode Power Transistor IGT60R070D1", Infineon Technologies AG, München, Germany, Oct. 12, 2018, 17 pp.

* cited by examiner

*Primary Examiner* — Tomi Skibinski
(74) *Attorney, Agent, or Firm* — Shumaker & Sieffert, P.A.

(57) ABSTRACT

A device for controlling a current controlled switching element includes an output node, a current driver circuit, and detection circuitry. The output node is configured to electrically couple to a control node of the current controlled switching element. The current controlled switching element is configured to change from operating in an off-state to operating in an on-state when a charge supplied to the control node causes a voltage at the control node to be greater than an activation threshold. The current driver circuit configured to output an activation current to the output node in response to a switching signal indicating to change from operating the current controlled switching element from the off-state to the on-state. The detection circuitry is configured to detect, based on the voltage at the control node, when a switching event has occurred while the current driver circuit outputs the activation current.

20 Claims, 13 Drawing Sheets

GATE DRIVER CIRCUIT FOR CURRENT CONTROLLED SWITCHING ELEMENT

TECHNICAL FIELD

This disclosure relates to device controlling a current controlled switching element, for example, a gate-injection-transistor (GIT) switching element.

BACKGROUND

A circuit may be configured to control a current controlled switching element. For example, the circuit may control the current controlled switching element to operate in an on-state to allow current to flow through the current controlled switching element and to operate in an off-state to block current from flowing through the current controlled switching element.

SUMMARY

The disclosure describes techniques, devices, and systems for controlling a current controlled switching element, for example, a gate-injection-transistor (GIT) switching element. In accordance with the techniques of the disclosure, a device may be configured to detect, based on a voltage at a control node of a current controlled switching element, when a switching event has occurred while a current driver circuit outputs activation current. In this example, the device may output a hold current to the output node when the switching event has occurred. The activation current may be sufficient to supply a charge to the control node to cause the voltage at the control node to be greater than an activation threshold. The hold current may be sufficient to charge the control node to maintain the voltage at the control node to remain greater than the activation threshold. In this way, the device may reduce an amount of power used to switch the current controlled switching element compared to devices using a preconfigured time. Moreover, reducing the power losses to switch the current controlled switching element may help to reduce an amount of waste heat generated by the current controlled switching element, which may help to increase a reliability of the current controlled switching element and/or help to reduce an amount of heat dissipation needed for a system.

In some examples, a device for controlling a current controlled switching element includes an output node configured to electrically couple to a control node of the current controlled switching element. The current controlled switching element is configured to change from operating in an off-state to operating in an on-state when a charge supplied to the control node causes a voltage at the control node to be greater than an activation threshold. The device further includes a current driver circuit configured to output an activation current to the output node in response to a switching signal indicating to change from operating the current controlled switching element from the off-state to the on-state. The activation current is configured to supply the charge to the control node to cause the voltage at the control node to be greater than the activation threshold. The device further includes detection circuitry configured to detect, based on the voltage at the control node, when a switching event has occurred while the current driver circuit outputs the activation current. The current driver circuit is further configured to output a hold current to the output node when the detection circuitry has detected the switching event has occurred.

In some examples, a method includes determining a switching signal indicates to change from operating a current controlled switching element from an off-state to an on-state. The current controlled switching element is configured to change from operating in the off-state to operating in the on-state when a charge supplied to a control node of the current controlled switching element causes a voltage at the control node to be greater than an activation threshold. In response to the switching signal indicating to change from operating the current controlled switching element from the off-state to the on-state, the method includes outputting an activation current to an output node configured to electrically couple to the control node. The activation current being configured to supply the charge to the control node to cause the voltage at the control node to be greater than the activation threshold. The method further includes detecting, based on the voltage at the control node, when a switching event has occurred while outputting the activation current and outputting a hold current to the output node when detecting that the switching event has occurred.

In some examples, a system includes a current controlled switching element configured to change from operating in an off-state to operating in an on-state when a charge supplied to a control node of the current controlled switching element causes a voltage at the control node to be greater than an activation threshold. The system further includes driver circuitry including an output node configured to electrically couple to the control node of the current controlled switching element and a current driver circuit configured to output an activation current to the output node in response to a switching signal indicating to change from operating the current controlled switching element from the off-state to the on-state. The activation current is configured to supply the charge to the control node to cause the voltage at the control node to be greater than the activation threshold. The driver circuitry further includes detection circuitry configured to detect, based on the voltage at the control node, when a switching event has occurred while the current driver circuit outputs the activation current. The current driver circuit is further configured to output a hold current to the output node when the detection circuitry has detected the switching event has occurred.

The details of one or more examples are set forth in the accompanying drawings and the description below. Other features, objects, and advantages of the disclosure will be apparent from the description and drawings, and from the claims.

DETAILED DESCRIPTION

Figure 1:
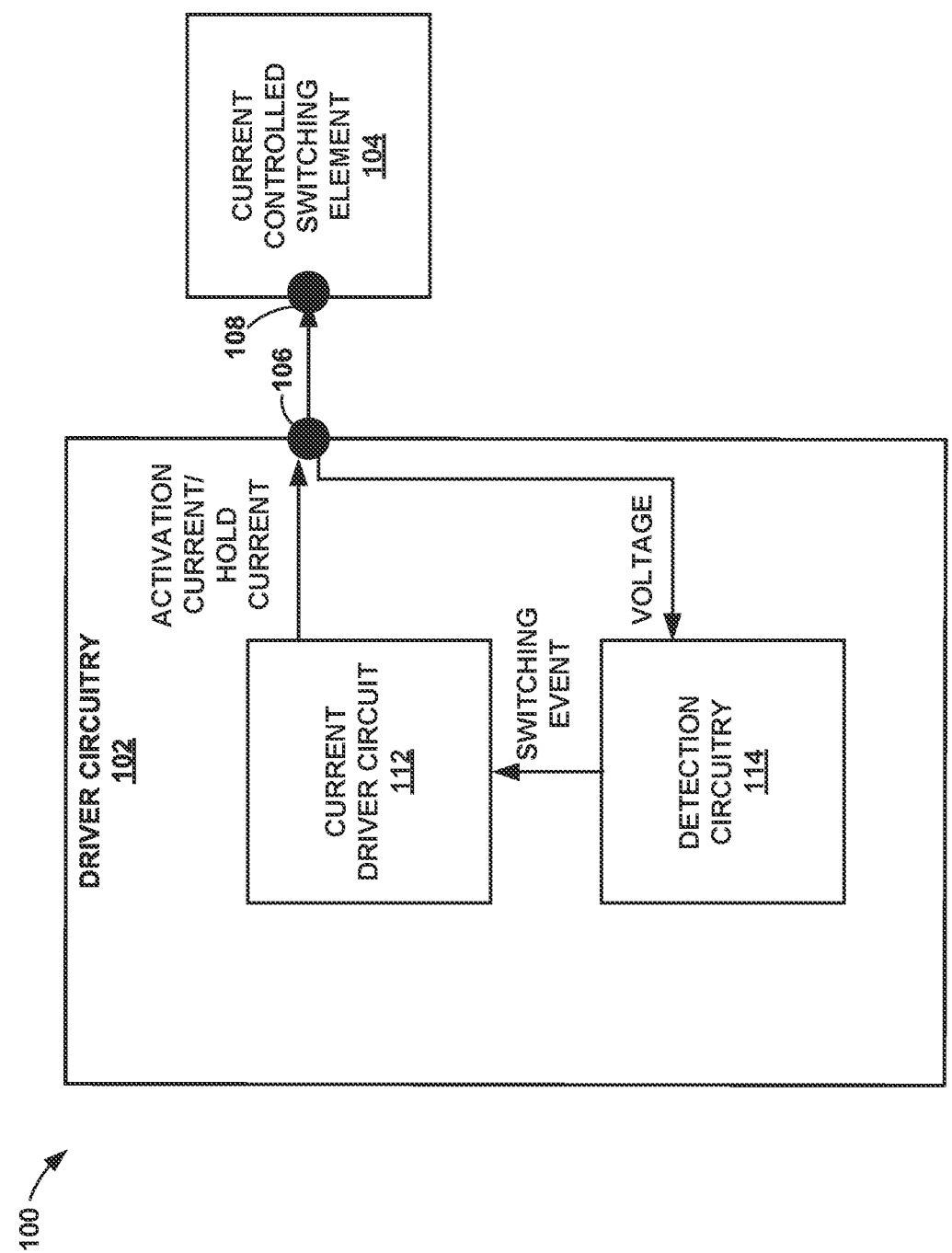
FIG. 1 is a block diagram illustrating an example system configured for controlling a current controlled switching element, in accordance with one or more techniques of this disclosure.

The disclosure describes techniques, devices, and systems for controlling a current controlled switching element, for example, a gate-injection-transistor (GIT) switching element. For example, a current controlled switching element may use an activation current to change from an off-state to an on-state. However, maintaining the activation current during an entire time period that the current controlled switching element is in the on-state may damage the current controlled switching element. As such, some devices may include circuitry that provides the activation current during a preconfigured time and then a hold current. In this way, the current controlled switching element may change from the off-state to the on-state without damaging the current controlled switching element.

In accordance with the techniques of the disclosure, driver circuitry may be configured to detect, based on a voltage at a control node of a current controlled switching element, when a switching event has occurred while a current driver circuit outputs activation current. In this example, the driver circuitry may output a hold current to the output node when the switching event has occurred. The activation current may be sufficient to supply a charge to the control node to cause the voltage at the control node to be greater than an activation threshold. The hold current may be sufficient to charge the control node to maintain the voltage at the control node to remain greater than the activation threshold. In this way, the driver circuitry may reduce an amount of power used to switch the current controlled switching element compared to devices using a preconfigured time. Moreover, reducing the power losses to switch the current controlled switching element may help to reduce an amount of waste heat generated by the current controlled switching element, which may help to increase a reliability of the current controlled switching element and/or help to reduce an amount of heat dissipation needed for a system.

In some examples, driver circuitry may include a timer configured to cause driver circuitry to output hold current instead of activation current after a threshold amount of time has elapsed since controlling the current controlled switching element to change to the on-state. For example, the driver circuitry may initiate a timer in response to a switching cycle of a switching signal indicating to change from operating the current controlled switching element from the off-state to the on-state. In this example, the driver circuitry may output a signal based on the timer. The driver circuitry may be configured to output the hold current when the timer circuitry outputs the signal. In this way, the driver circuitry may help to ensure that the activation current is supplied to the current controlled switching element for no more than the threshold amount of time, which may reduce or eliminate the risk of the activation current damaging the current controlled switching element.

In some examples, driver circuitry may include a low-current driver circuit configured to output the hold current to the output node while the switching signal indicates to operate the current controlled switching element in the on-state. In this example, the driver circuitry may further include a high-current driver circuit configured to output, for only a portion of a time when the switching signal indicates to operate the current controlled switching element in the on-state, a supplementary current to the output node that when combined with the hold current output by the low-current driver circuit forms the activation current. In this way, the low current driver may be implemented to provide a relatively high precision current with a relatively low switching rate (e.g., a current source) and the high current driver may be implemented to provide a relatively low precision current with a relatively high switching rate (e.g., a resistor and switching element arranged in series), which may reduce complexity of the driver circuitry and/or reduce a cost of the driver circuitry compared to systems using a single current driver to provide both the activation current and the hold current.

FIG. 1 is a block diagram illustrating an example system 100 configured for controlling a current controlled switching element 104, in accordance with one or more techniques of this disclosure. Driver circuitry 102 includes current driver circuit 112, detection circuitry 114, and output node 106.

Driver circuitry 102 may be configured to control current controlled switching element 104 to operate in an on-state or an off-state. Driver circuitry 102 may include current driver circuit 112 and detection circuitry 114. Driver circuitry 102 may include an analog circuit. In some examples, driver circuitry 102 may include a microcontroller on a single integrated circuit containing a processor core, memory, inputs, and outputs. For example, driver circuitry 102 may include one or more of an application specific integrated circuit (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. Driver circuitry 102 may be a combination of one or more analog components and one or more digital components.

Current controlled switching element 104 may represent a switching element configured to switch in or switch out based on a current. For example, current controlled switching element 104 may include a gallium nitride (GaN) switching element. In some examples, current controlled switching element 104 may include a gate-injection-transistor (GIT) switching element. In particular, current controlled switching element 104 may refer to a current controlled GIT that comprises a semiconductor structure formed in GaN. While examples described herein may be directed to controlling a GIT switching elements for example purposes, techniques described herein for controlling a GIT switching element may be applied to any switching element that is controlled to change from operating in an off-state to operating in an on-state using an activation current and a hold current. As used herein, a switching element that is controlled to "switch in" or operate in a "on-state" may refer to a state of the switching element where the switching element establishes an electrically conductive channel connecting a first node (e.g., a drain or collector) and a second node (e.g., a source or emitter). Similarly, a switching element that is controlled to "switch out" or operate in a "off-state" may refer to a state of the switching element where the switching element does not establish the electrically conductive channel connecting the first node and the second node.

Output node 106 may be configured to electrically couple to a control node 108 of current controlled switching element 104. Current controlled switching element 104 may be configured to change from operating in the off-state to operating in the on-state when a charge supplied to control node 108 causes a voltage at control node 108 to be greater than an activation threshold. For example, the voltage at control node 108 of current controlled switching element 104 may respond to current similar to a capacitor. Output node 106 may represent a pin of a package (e.g., a chip that implements driver circuitry 102) to electrically couple the package to a control node 108 of current controlled switching element 104. In some examples, however, output node 106 may represent an internal node of a single package that includes both driver circuitry 102 and current controlled switching element 104.

Current driver circuit 112 may output an activation current to output node 106 in response to a switching signal indicating to change from operating current controlled switching element 104 from the off-state to the on-state. The activation current may be configured to supply the charge to control node 108 of current controlled switching element 104 to cause the voltage at control node 108 to be greater than the activation threshold.

Detection circuitry 114 may detect, based on the voltage at control node 108, when a switching event has occurred while current driver circuit 112 outputs the activation current. For example, detection circuitry 114 may determine that the switching event has occurred when the voltage at control node 108 exceeds a reference voltage. For instance, detection circuitry 114 may include a comparator configured to compare the voltage at control node 108 with a reference voltage. In this example, detection circuitry 114 may detect that the switching event has occurred when the comparator outputs a logical '0' value indicating that the voltage at control node 108 exceeds the reference voltage.

Current driver circuit 112 may output a hold current to output node 106 in response to detection circuitry 114 detecting that the switching event has occurred. The hold current may be sufficient to charge control node 108 to maintain the voltage at control node 108 to remain greater than the activation threshold. In this way, the hold current may be less than the activation current while maintaining current controlled switching element 104 in the on-state, which may reduce an amount of power used to switch current controlled switching element 104 compared to devices using only a preconfigured time. Moreover, reducing the power losses to switch current controlled switching element 104 may help to reduce an amount of waste heat generated by current controlled switching element 104, which may help to increase a reliability of current controlled switching element 104 and/or help to reduce an amount of heat dissipation needed for system 100.

Figure 2:
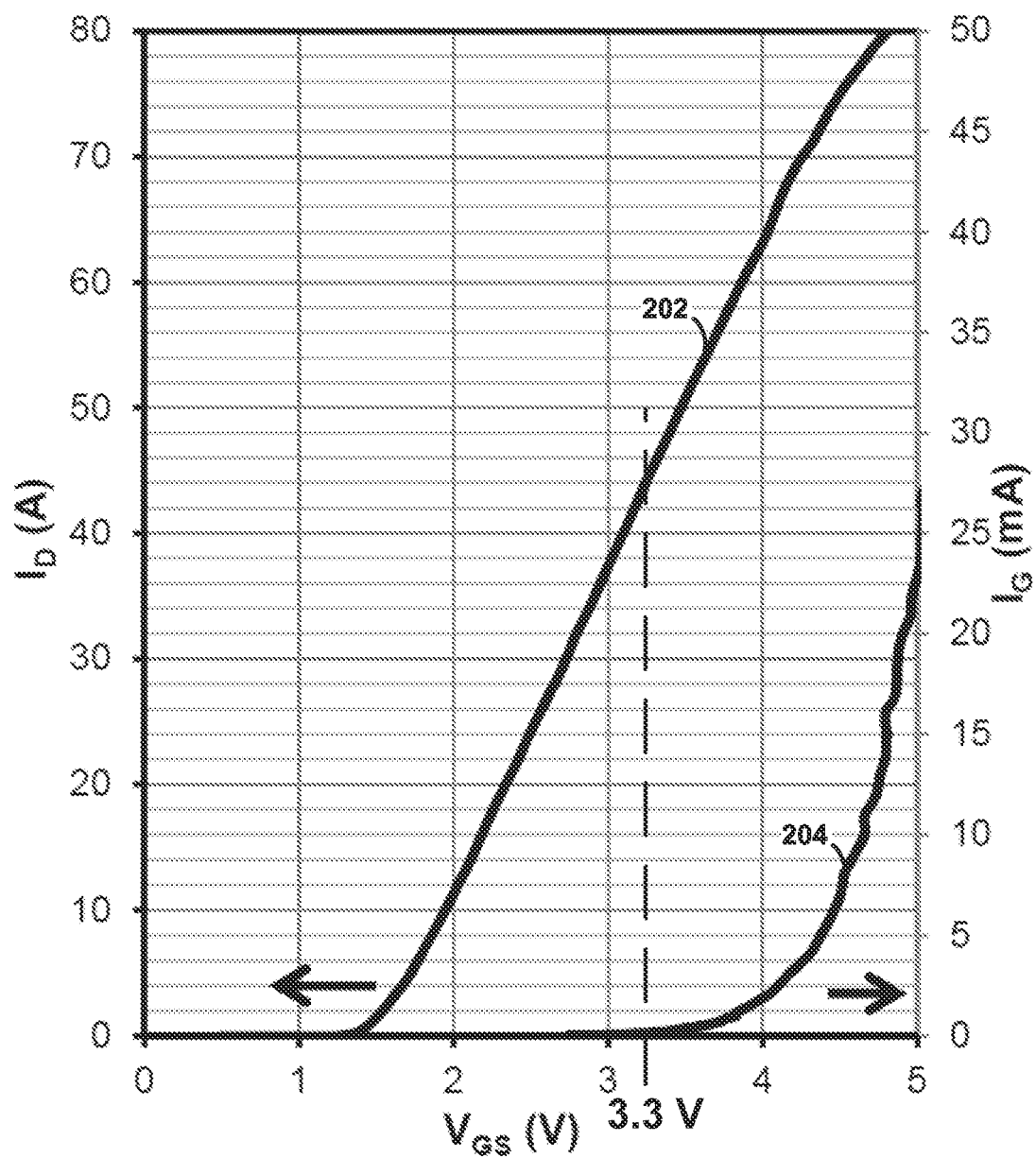
FIG. 2 is a plot diagram illustrating an example behavior of a current controlled switching element, in accordance with one or more techniques of this disclosure.

FIG. 2 is a plot diagram illustrating an example behavior of a current controlled switching element, in accordance with one or more techniques of this disclosure. The horizontal axis (x-axis) of FIG. 2 represents a gate voltage ($V_{GS}(V)$) at control node 108 in volts. The vertical axis (y-axis) of FIG. 2 represents a drain current 202 ($I_D(A)$) at a drain of current controlled switching element 104 in amps and a gate current 204 ($I_G(mA)$) at control node 108 in milliamps. FIG. 2 is directed to a voltage drain-to source of 8 volts and a temperature of 25° C.

FIG. 2 illustrates a dedicated gate-profile transfer function. With a switching element that operates according to the gate profile shown in the example of FIG. 2, one challenge is to quickly switch current controlled switching element 104 without damaging current controlled switching element 104. As shown in the example of FIG. 2, gate current 204 of less than 1.25 mA results in a gate voltage 3.3 volts and drain current 202 of 45 amps.

Figure 3:
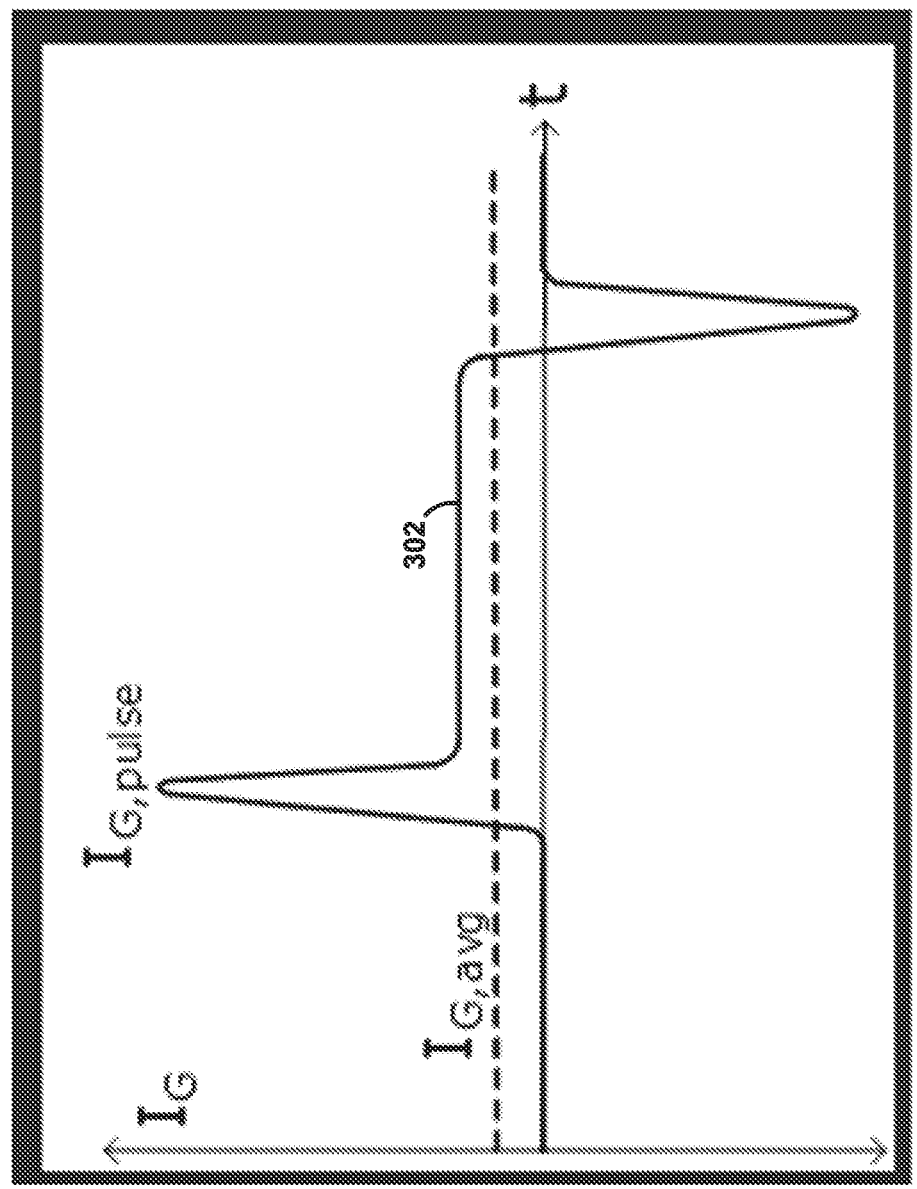
FIG. 3 is a conceptual diagram of control current to drive a current controlled switching element, in accordance with one or more techniques of this disclosure.

FIG. 3 is a conceptual diagram of control current to drive a current controlled switching element, in accordance with one or more techniques of this disclosure. The horizontal axis (x-axis) of FIG. 3 represents time. The vertical axis (y-axis) of FIG. 3 represents a gate current 302 ($I_{G,avg}$) at control node 108 in amps. The following refers to a GaN device as a current controlled switching element for example purposes only.

In the example of FIG. 3, driver circuitry 102 may output, to allow switching of a GaN-Gate-Structure, a high current pulse ($I_{G,pulse}$), which is referred to herein as an activation current, for a dedicated time for switching. In this example, driver circuitry 102 may output a much lower steady-state current, referred to herein as a holding current, after the turn on of the GaN-Gate-Structure. The activation pulse may be configured for a fast turn on and turn off (e.g., a high current peak). In contrast, the hold current may be configured for lower steady-state current after the turn on. The hold current may be sufficient to charge control node 108 to maintain the voltage at control node 108 to remain greater than the activation threshold.

Figure 4:
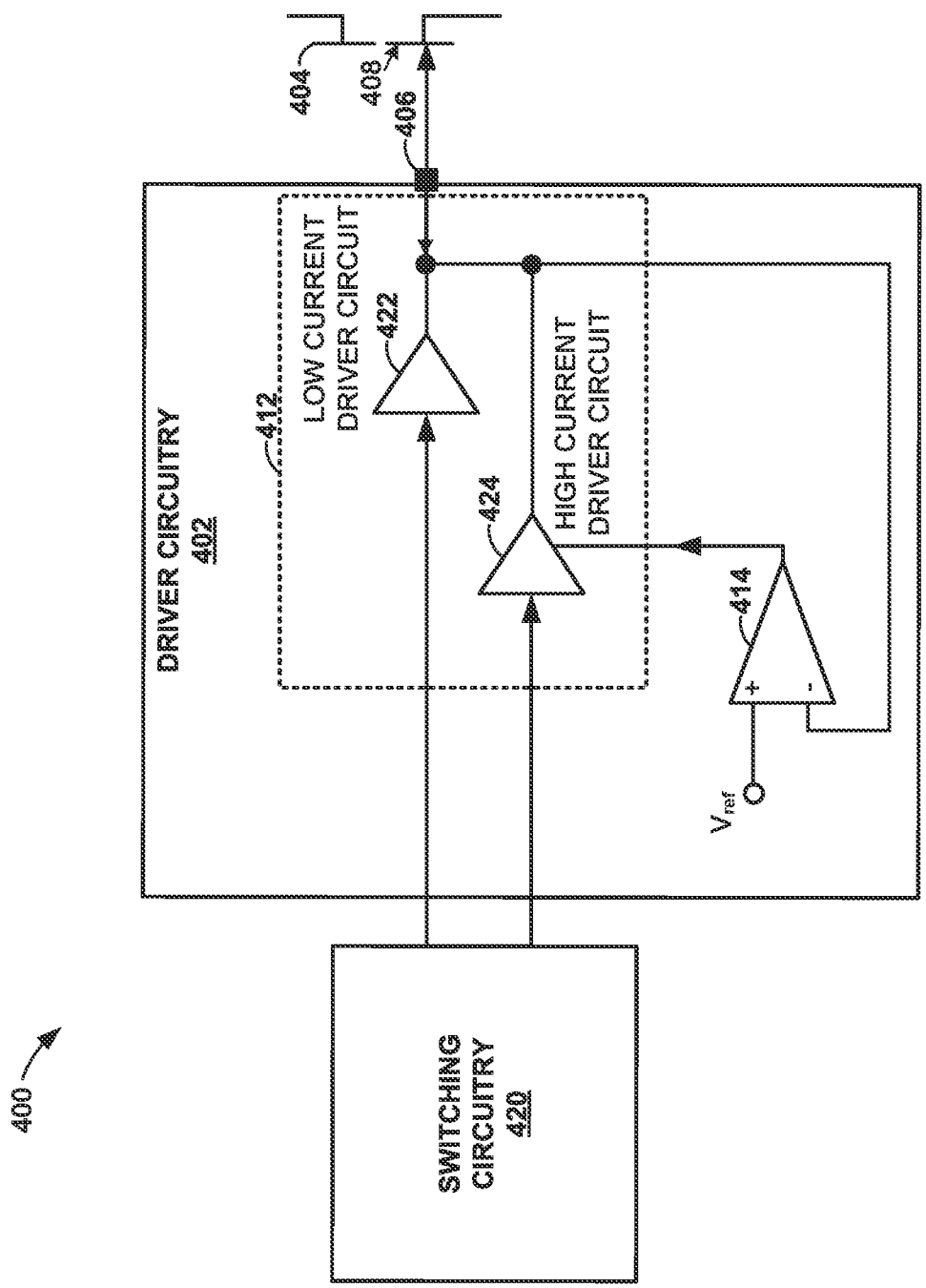
FIG. 4 is a block diagram illustrating an example system configured for controlling a current controlled switching element using a low-current driver circuit and a high-current driver circuit, in accordance with one or more techniques of this disclosure.

FIG. 4 is a block diagram illustrating an example system 400 configured for controlling a current controlled switching element 404 using a low-current driver circuit 422 and a high-current driver circuit 424, in accordance with one or more techniques of this disclosure. As shown in FIG. 4, system 400 includes switching circuitry 420, driver circuitry 402, and current controlled switching element 404. Driver circuitry 402 may include low-current driver circuit 422, high-current driver circuit 424, and comparator 414.

Switching circuitry 420 may be configured to generate a switching signal, for example, a pulse-width modulated (PWM) signal or other type of pulse modulated signal such as a pulse density modulated signal, a pulse duration modulated signal, a pulse frequency modulated signal, or another type of modulation. The switching signal may indicate a when to operate current controlled switching element 404 in an on-state (e.g., a high portion of the PWM signal) and when to operate in a current controlled switching element 404 in an off-state (e.g., a low portion of the PWM signal). The switching signal may indicate additional portions, for example, a dead-time portion of the PWM signal.

System 400 may include an active feedback from a control node 408 of current controlled switching element 404 (e.g., a gate of a GaN device) to driver circuitry 402 to automatically sense a switch on event and reduce the driver strength. For example, the active feedback may represent feedback from control node 408. In this example, driver circuitry 402 may detect that the switching event has occurred when the voltage at control node 408, as detected using output node 406, exceeds a reference voltage. For instance, the active feedback may represent feedback from control node 408 to a negative terminal of comparator 414. In this instance, a positive terminal of comparator 414 may be electrically coupled to a reference voltage ($V_{ref}$). Comparator 414 may output a first value (e.g., a logical 0) when the voltage at the control node of current controlled switching element 404 exceeds a reference voltage and a second value (e.g., a logical 1) when the voltage at the control node of current controlled switching element 404 does not exceed the reference voltage.

In the example of FIG. 4, low-current driver circuit 422 may output a hold current to output node 406 while the switching signal indicates to operate current controlled switching element 404 in the on-state. For instance, low-current driver circuit 422 may output a hold current to output node 406 during a high portion of a PWM signal output by switching circuitry 420. In this instance, low-current driver circuit 422 may stop outputting the hold current to output node 406 during a low portion of a PWM signal output by switching circuitry 420 and/or during a deadtime portion of the PWM signal.

High-current driver circuit 424 may output, for only a portion of a time when the switching signal output by switching circuitry 420 indicates to operate current controlled switching element 404 in the on-state, a supplementary current to output node 406 that when combined with the hold current output by low-current driver circuit 422 forms activation current. For instance, high-current driver circuit 424 may output the supplementary current to output node 406 initially during the high portion of a PWM signal output by switching circuitry 420 and stop outputting the supplementary current when the comparator 414 detects that the switching event has occurred. High-current driver circuit 424 may refrain from outputting the supplementary current to output node 406 while the switching signal indicates to operate the current controlled switching element in the off-state (e.g., during a low portion of a PWM signal output by switching circuitry 420 and/or during a deadtime portion of the PWM signal). In this way, low-current driver circuit 422 may be implemented to provide a relatively high precision current with a relatively low switching rate (e.g., a current source) and high-current driver circuit 424 may be implemented to provide a relatively low precision current with a relatively high switching rate (e.g., a resistor and switching element arranged in series), which may reduce complexity of the driver circuitry and/or reduce a cost of the driver circuitry compared to systems using a single current driver to provide both the activation current and the hold current.

Figure 5:
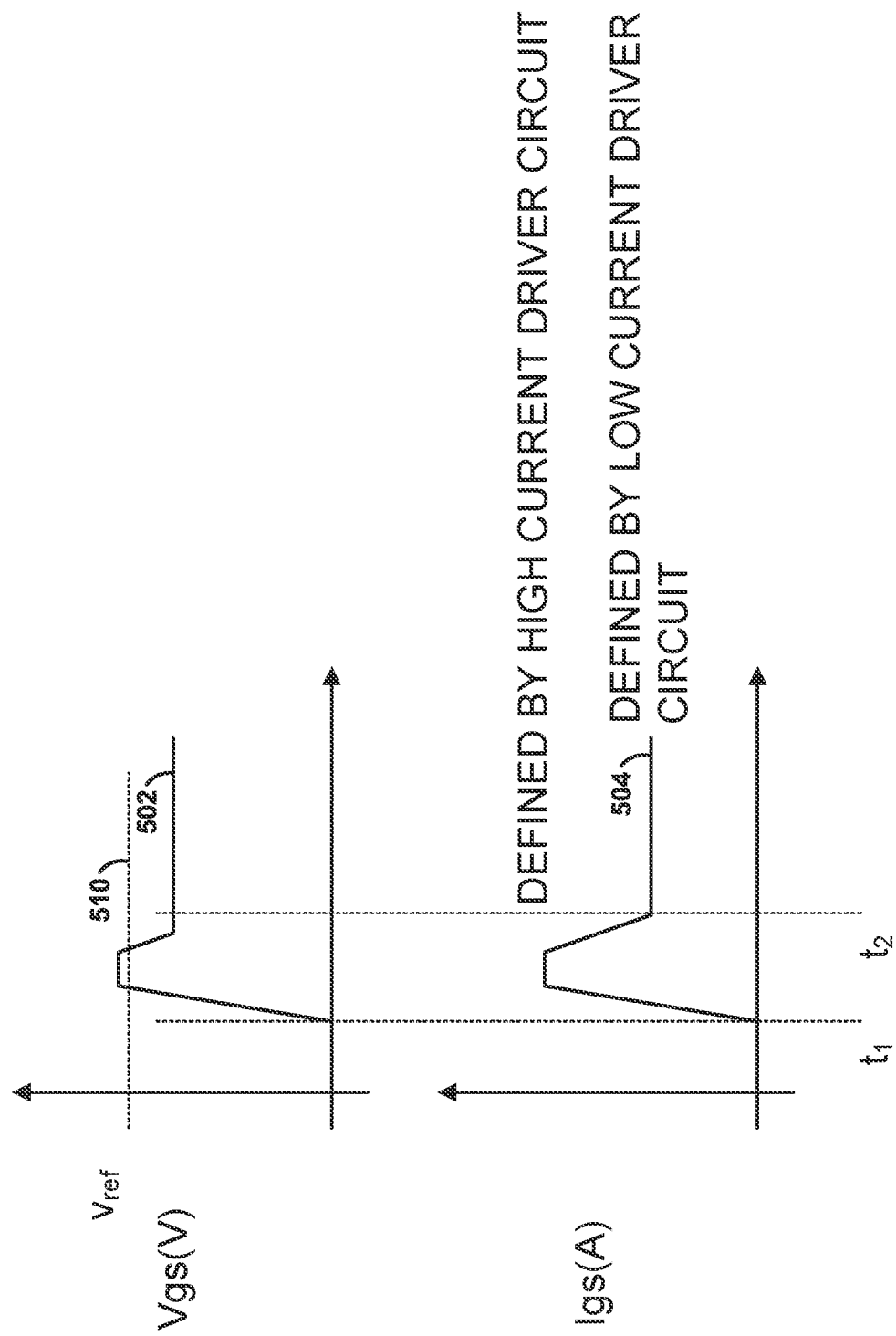
FIG. 5 is a plot diagram illustrating an example voltage at a control node of the current controlled switching element of FIG. 4 and a current at the control node, in accordance with one or more techniques of this disclosure.

FIG. 5 is a plot diagram illustrating an example voltage at a control node of the current controlled switching element 404 of FIG. 4 and a current at the control node 408, in accordance with one or more techniques of this disclosure. The horizontal axis (x-axis) of FIG. 5 represents time. The vertical axis (y-axis) of FIG. 5 represents a gate voltage ($V_{GS}(V)$) 502 of current controlled switching element 404 in volts and a gate-to-source current ($I_{GS}(A)$) 504 of current controlled switching element 404 in amps.

In the example of FIG. 5, at time $t_1$, low-current driver circuit 422 outputs hold current to control node 408 and high-current driver outputs supplemental current to control node 408, which results in gate voltage 502 and gate-to-source current 504. In this example, driver circuitry 402, or more specifically, for example, comparator 414, may detect that the switching event has occurred when gate voltage 502 exceeds a reference voltage ($V_{ref}$) 510. High-current driver circuit 424 may stop outputting the supplementary current when the driver circuitry 402 detects that the switching event has occurred, which at time $t_2$ results in gate-to-source current 504 dropping to the hold current output by low-current driver circuit 422.

Figure 6:
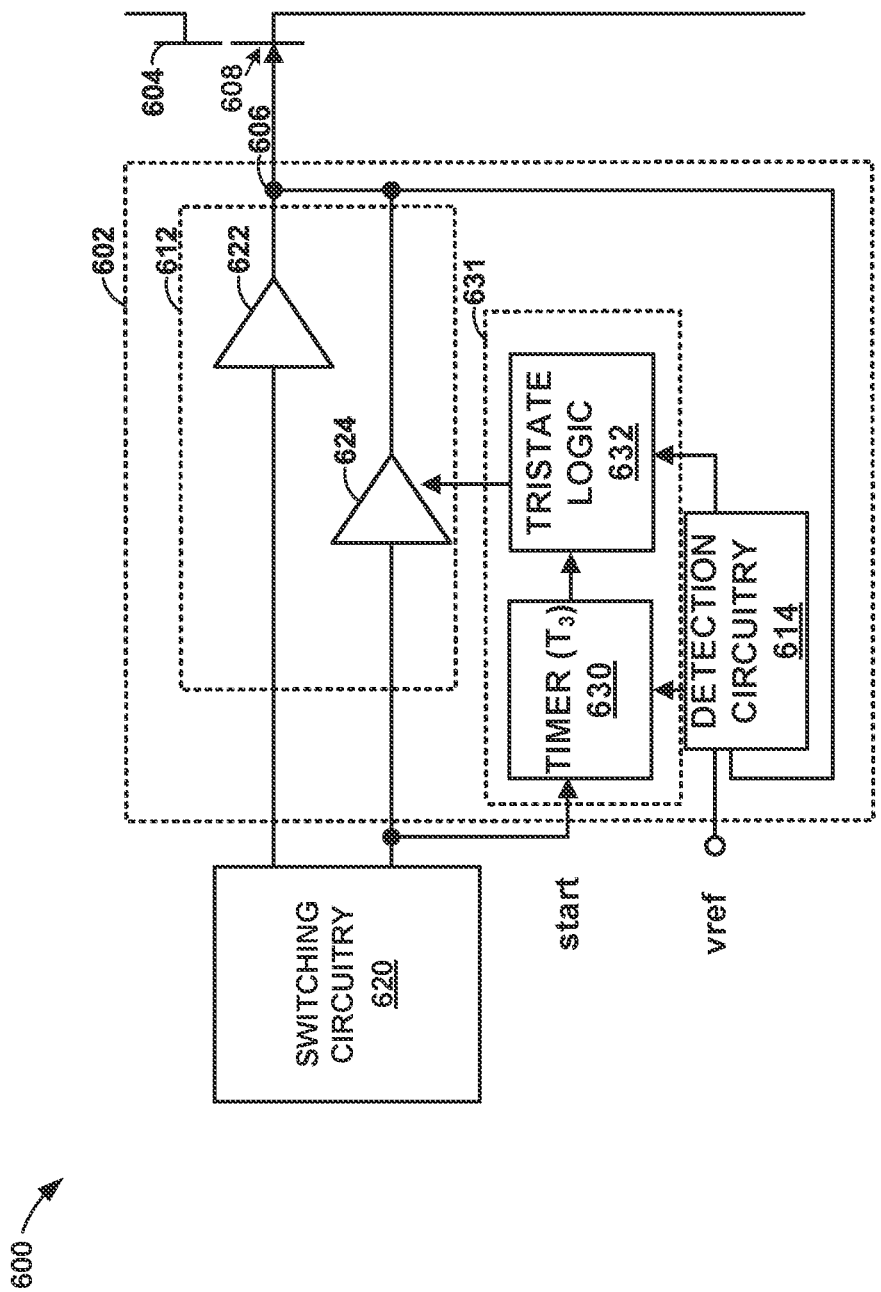
FIG. 6 is a block diagram illustrating an example system configured for controlling a current controlled switching element using a low-current driver circuit, a high-current driver circuit, and a timer, in accordance with one or more techniques of this disclosure.

FIG. 6 is a block diagram illustrating an example system 600 configured for controlling a current controlled switching element 604 using a low-current driver circuit 622, a high-current driver circuit 624, and a timer 630, in accordance with one or more techniques of this disclosure. As shown in FIG. 6, system 600 includes switching circuitry 620, driver circuitry 602, and current controlled switching element 604. Driver circuitry 602 may include current driver 612, which includes low-current driver circuit 622 and high-current driver circuit 624, detection circuitry 614, and timer circuitry 631. Timer circuitry 631 may include timer 630 and tristate logic 632. Switching circuitry 620 may be configured to generate a switching signal, for example, a pulse-width modulated (PWM) signal.

Timer circuitry 631 may initiate timer 630 in response to the switching cycle of a switching signal output by switching circuitry 620 indicating to change from operating current controlled switching element 604 from the off-state to the on-state. In this example, timer circuitry 631, or more specifically, for example, tristate logic 632 may output a signal based on the timer. For example, timer circuitry 631, or more specifically, for example, tristate logic 632 may determine, after the initiation of timer 630, whether detection circuitry 614 has detected the switching event and may output the signal when both the timer exceeds a threshold time value and detection circuitry 614 has not detected the switching event.

In response to the switching cycle of a switching signal output by switching circuitry 620 indicating to change from operating current controlled switching element 604 from the off-state to the on-state, current driver circuit 612 may output an activation current to control node 608. For example, low-current driver circuit 622 may output the hold current and high-current driver circuit 624 may output supplementary current to output node 606. Current driver circuit 612 may output the hold current to output node 606 when timer circuitry 631 outputs the signal. For example, low-current driver circuit 622 may output the hold current and high-current driver circuit 624 may stop outputting supplementary current to output node 606. In this way, driver circuitry 602 may help to ensure that the activation current is supplied to the current controlled switching element for no more than the threshold amount of time, which may reduce or eliminate the risk of the activation current damaging current controlled switching element 604.

Figure 7:
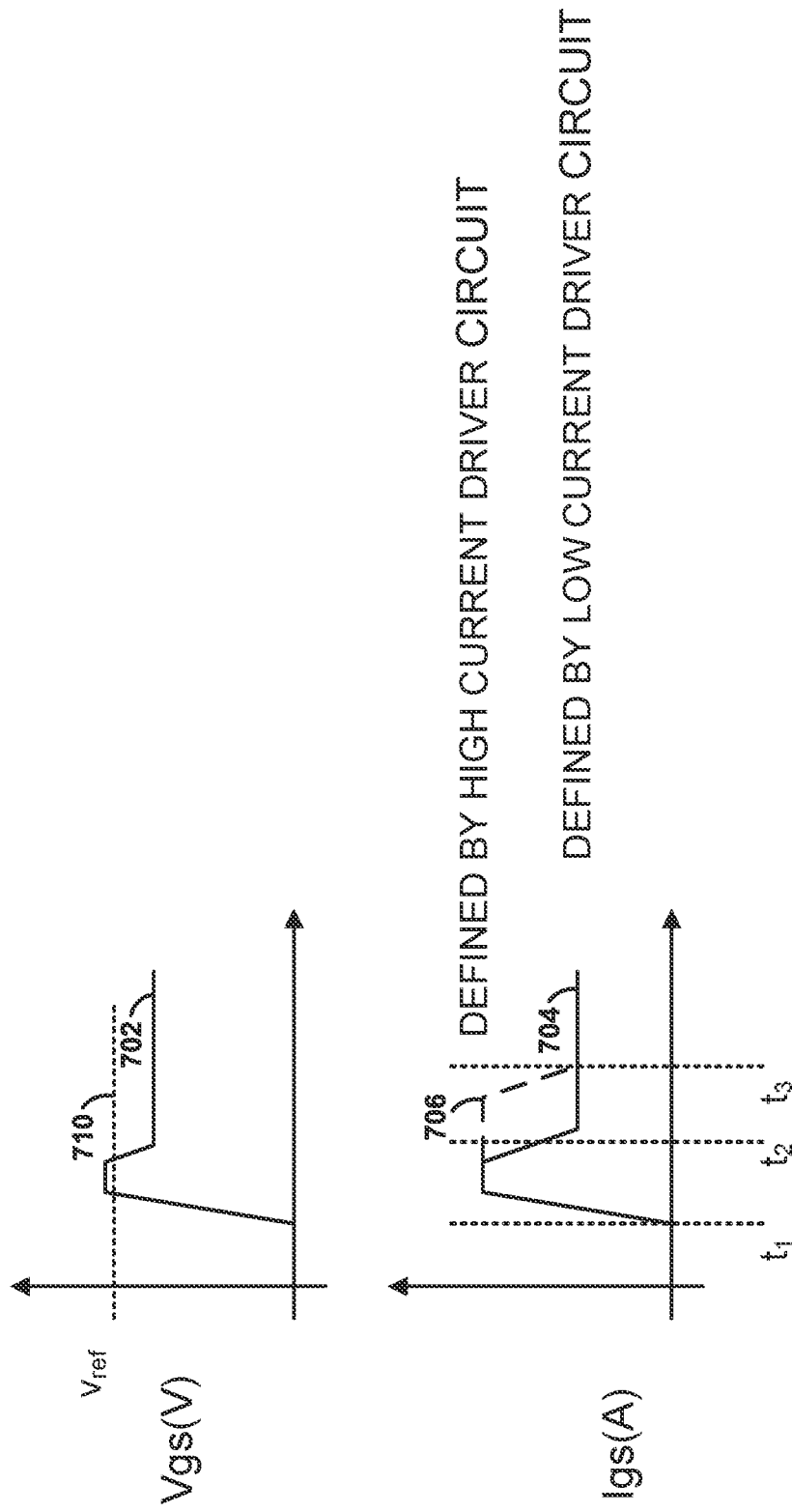
FIG. 7 is a plot diagram illustrating an example voltage at a control node of the current controlled switching element of FIG. 6 and a current at the control node, in accordance with one or more techniques of this disclosure.

FIG. 7 is a plot diagram illustrating an example voltage at a control node of current controlled switching element 604 of FIG. 6 and a current at the control node, in accordance with one or more techniques of this disclosure. The horizontal axis (x-axis) of FIG. 7 represents time. The vertical axis (y-axis) of FIG. 7 represents a gate voltage ($V_{GS}(V)$) 702 of current controlled switching element 604 in volts, a first gate-to-source current ($I_{GS}(A)$) 704 of current controlled switching element 604 in amps, and a second gate-to-source current ($I_{GS}(A)$) 706 of current controlled switching element 604 in amps.

In the example of FIG. 7, at time $t_1$, low-current driver circuit 622 outputs hold current to control node 608 and high-current driver outputs supplemental current to control node 608, which results in gate voltage 702 and gate-to-source current 704. In this example, driver circuitry 602, or more specifically, for example, detection circuitry 614, may detect that the switching event has occurred when gate voltage 702 exceeds a reference voltage ($V_{ref}$) 710. High-current driver circuit 624 may stop outputting the supplementary current when the driver circuitry 602 detects that the switching event has occurred, which at time $t_2$ results in gate-to-source current 704 dropping to the hold current output by low-current driver circuit 622. The time $t_2$ may be defined by a feedback loop from control node 608 and/or detection circuitry 614.

In an instance where driver circuitry 602 does not detect that the switching event has occurred, timer circuitry 631 may help to ensure that activation current does not damage controlled switching element 604. For example, timer circuitry 631, or more specifically, for example, tristate logic 632 may determine, after the initiation of timer 630, whether detection circuitry 614 has detected the switching event and may output a signal when both timer 630 exceeds a threshold time value and detection circuitry 614 has not detected the switching event. Current driver circuit 612 may output the hold current to output node 606 when timer circuitry 631 outputs the signal. For example, low-current driver circuit 622 may output the hold current and high-current driver circuit 624 may stop outputting supplementary current to output node 606. In this way, driver circuitry 602 may help to ensure that the activation current is supplied to the current controlled switching element for no more than the threshold amount of time $t_3$, which may reduce or eliminate the risk of the activation current damaging current controlled switching element 604. Time $t_3$ may represent a security time to help to ensure that driver circuitry 602 does not damage current controlled switching element 604.

Figure 8:
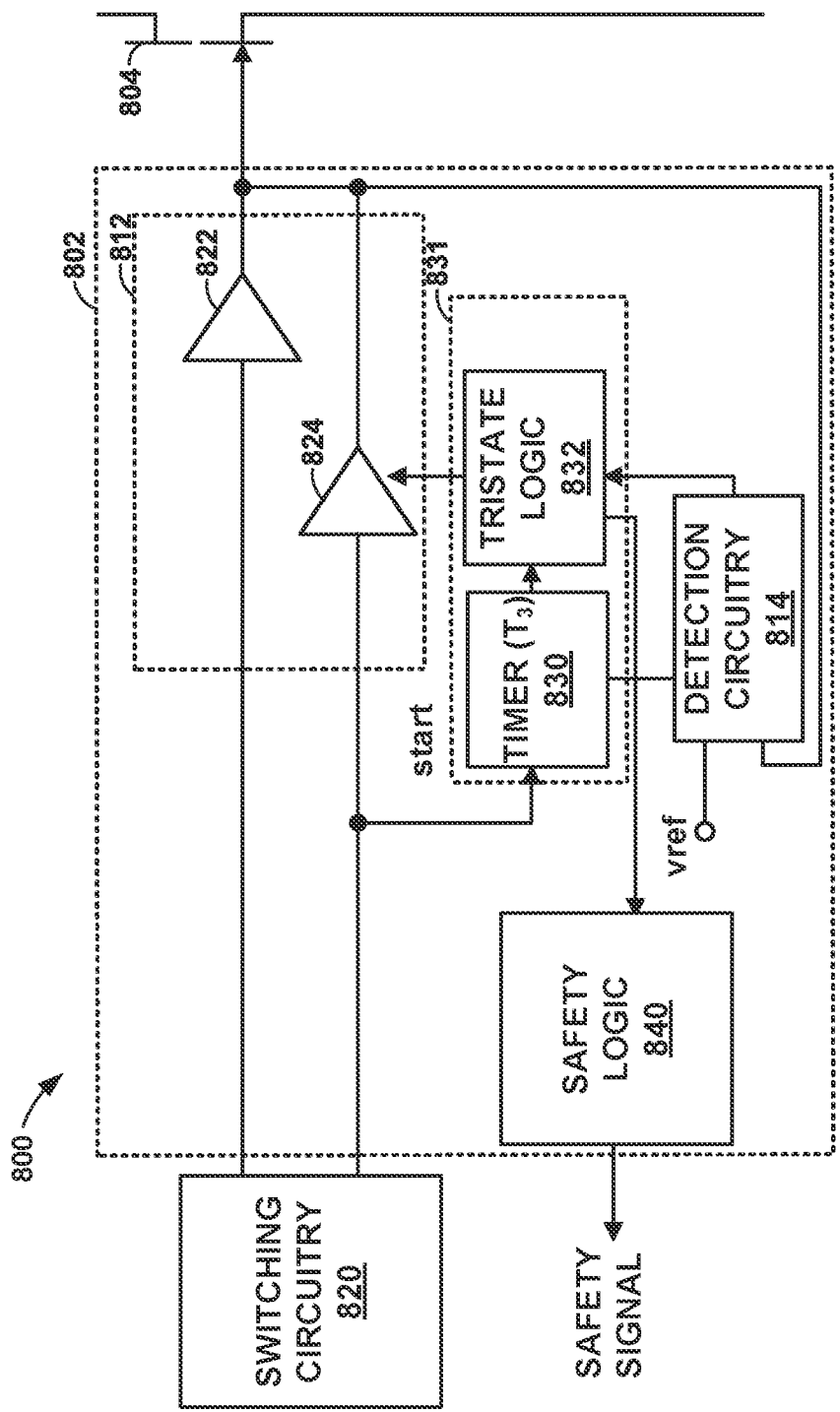
FIG. 8 is a block diagram illustrating an example system configured for controlling a current controlled switching element using a low-current driver circuit, a high-current driver circuit, a timer, and safety logic, in accordance with one or more techniques of this disclosure.

FIG. 8 is a block diagram illustrating an example system 800 configured for controlling a current controlled switching element 804 using a low-current driver circuit 822, a high-current driver circuit 824, a timer 830, and safety logic 840, in accordance with one or more techniques of this disclosure.

As shown in FIG. 8, system 800 includes switching circuitry 820, driver circuitry 802, and current controlled switching element 804. Driver circuitry 802 may include current driver 812, which includes low-current driver circuit 822 and high-current driver circuit 824, detection circuitry 814, and timer circuitry 831. Timer circuitry 831 may include timer 830 and tristate logic 832. Switching circuitry 820 may be configured to generate a switching signal, for example, a PWM signal.

In the example of FIG. 8, timer circuitry 831 may initiate timer 830 in response to the switching cycle of a switching signal output by switching circuitry 820 indicating to change from operating current controlled switching element 804 from the off-state to the on-state. In this example, timer circuitry 831, or more specifically, for example, tristate logic 832 may output a signal based on the timer. For example, timer circuitry 831, or more specifically, for example, tristate logic 832 may determine, after the initiation of timer 830, whether detection circuitry 814 has detected the switching event and may output the signal when both the timer exceeds a threshold time value and detection circuitry 814 has not detected the switching event. Safety logic 840 may output a safety signal when timer circuitry 831 outputs the signal.

Figure 9:
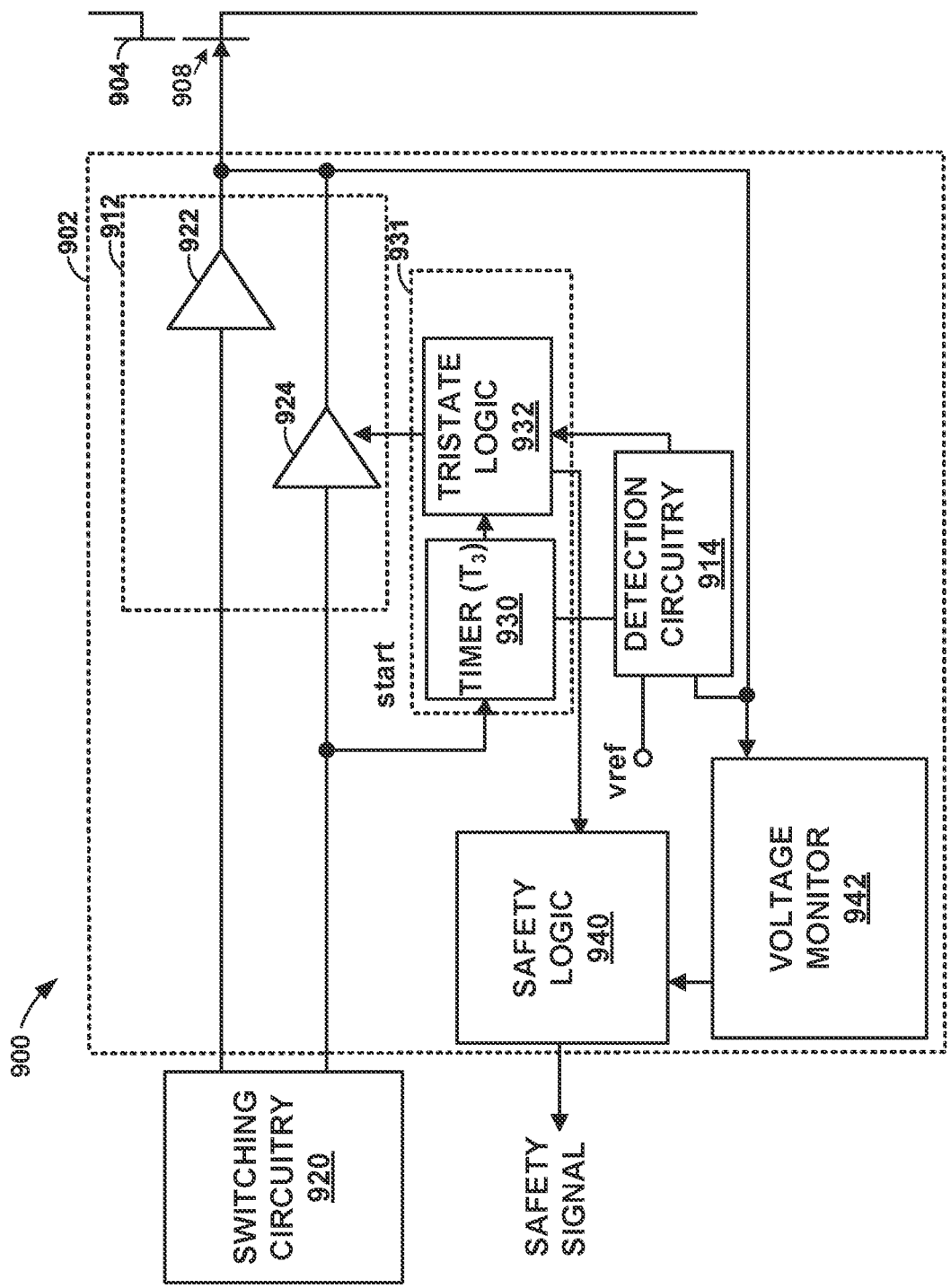
FIG. 9 is a block diagram illustrating an example system configured for controlling a current controlled switching element using a low-current driver circuit, a high-current driver circuit, a timer, safety logic, and a voltage monitor, in accordance with one or more techniques of this disclosure.

FIG. 9 is a block diagram illustrating an example system 900 configured for controlling a current controlled switching element 904 using a low-current driver circuit 922, a high-current driver circuit 924, a timer 930, safety logic 940, and a voltage monitor 942, in accordance with one or more techniques of this disclosure.

As shown in FIG. 9, system 900 includes switching circuitry 920, driver circuitry 902, and current controlled switching element 904. Driver circuitry 902 may include current driver circuit 912, which includes low-current driver circuit 922 and high-current driver circuit 924, detection circuitry 914, and timer circuitry 931. Timer circuitry 931 may include timer 930 and tristate logic 932. Switching circuitry 920 may be configured to generate a switching signal, for example, a PWM signal.

In the example of FIG. 9, timer circuitry 931 may initiate timer 930 in response to the switching cycle of a switching signal output by switching circuitry 920 indicating to change from operating current controlled switching element 904 from the off-state to the on-state. In this example, timer circuitry 931, or more specifically, for example, tristate logic 932 may output a signal based on the timer. For example, timer circuitry 931, or more specifically, for example, tristate logic 932 may determine, after the initiation of timer 930, whether detection circuitry 914 has detected the switching event and may output the signal when both the timer exceeds a threshold time value and detection circuitry 914 has not detected the switching event.

Similar to FIG. 8, safety logic 940 may output a safety signal when timer circuitry 931 outputs the signal. For example, safety logic may store a count for a number of times over a period of time. Moreover, driver circuitry 902 may include voltage monitor 942. Voltage monitor 942 may output an indication of the voltage at control node 908 to safety logic 940. For example, voltage monitor 942 may output a digital value representing a voltage at control node 908 to safety logic 940. In this example, safety logic 940 may output the indication of the voltage at control node 908 in the safety signal. For example, voltage monitor 942 may generate the indication of the voltage at control node 908 as a peak of the voltage at control node 908 while current driver circuit 912 operates current controlled switching element 904 in the on-state. For instance, voltage monitor 942 may generate a digital value indicating a peak voltage during an on portion of a switching period at control node 908.

Figure 10:
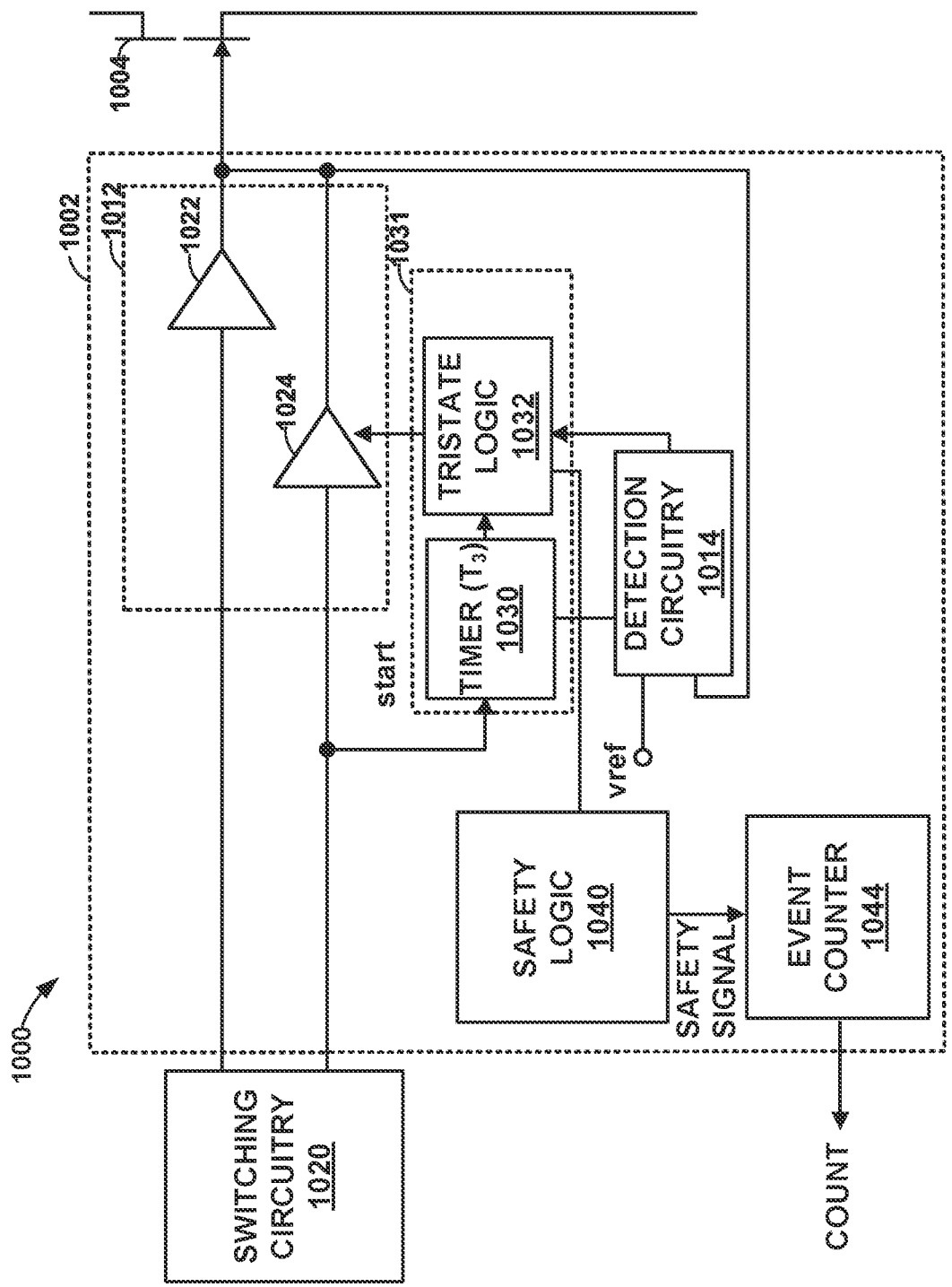
FIG. 10 is a block diagram illustrating an example system configured for controlling a current controlled switching element using a low-current driver circuit, a high-current driver circuit, a timer, safety logic, and an event counter, in accordance with one or more techniques of this disclosure.

FIG. 10 is a block diagram illustrating an example system 1000 configured for controlling a current controlled switching element 1004 using a low-current driver circuit 1022, a high-current driver circuit 1024, a timer 1030, safety logic 1040, and an event counter 1044, in accordance with one or more techniques of this disclosure.

As shown in FIG. 10, system 1000 includes switching circuitry 1020, driver circuitry 1002, and current controlled switching element 1004. Driver circuitry 1002 may include current driver 1012, which includes low-current driver circuit 1022 and high-current driver circuit 1024, detection circuitry 1014, and timer circuitry 1031. Timer circuitry 1031 may include timer 1030 and tristate logic 1032. Switching circuitry 1020 may be configured to generate a switching signal, for example, a PWM signal.

In the example of FIG. 10, timer circuitry 1031 may initiate timer 1030 in response to the switching cycle of a switching signal output by switching circuitry 1020 indicating to change from operating current controlled switching element 1004 from the off-state to the on-state. In this example, timer circuitry 1031, or more specifically, for example, tristate logic 1032 may output a signal based on the timer. For example, timer circuitry 1031, or more specifically, for example, tristate logic 1032 may determine, after the initiation of timer 1030, whether detection circuitry 1014 has detected the switching event and may output the signal when both the timer exceeds a threshold time value and detection circuitry 1014 has not detected the switching event.

Safety logic 1040 may output a safety signal when timer circuitry 1031 outputs the signal. Event counter 1044 may store a count for a number of times over a period of time. The period of time may be since initiation of driver circuitry 1002, since a periodic window of time (e.g., hourly or daily), and/or since a controller requested the count stored by event counter 1044. Event counter 1044 may output the count to a microcontroller.

Figure 11:
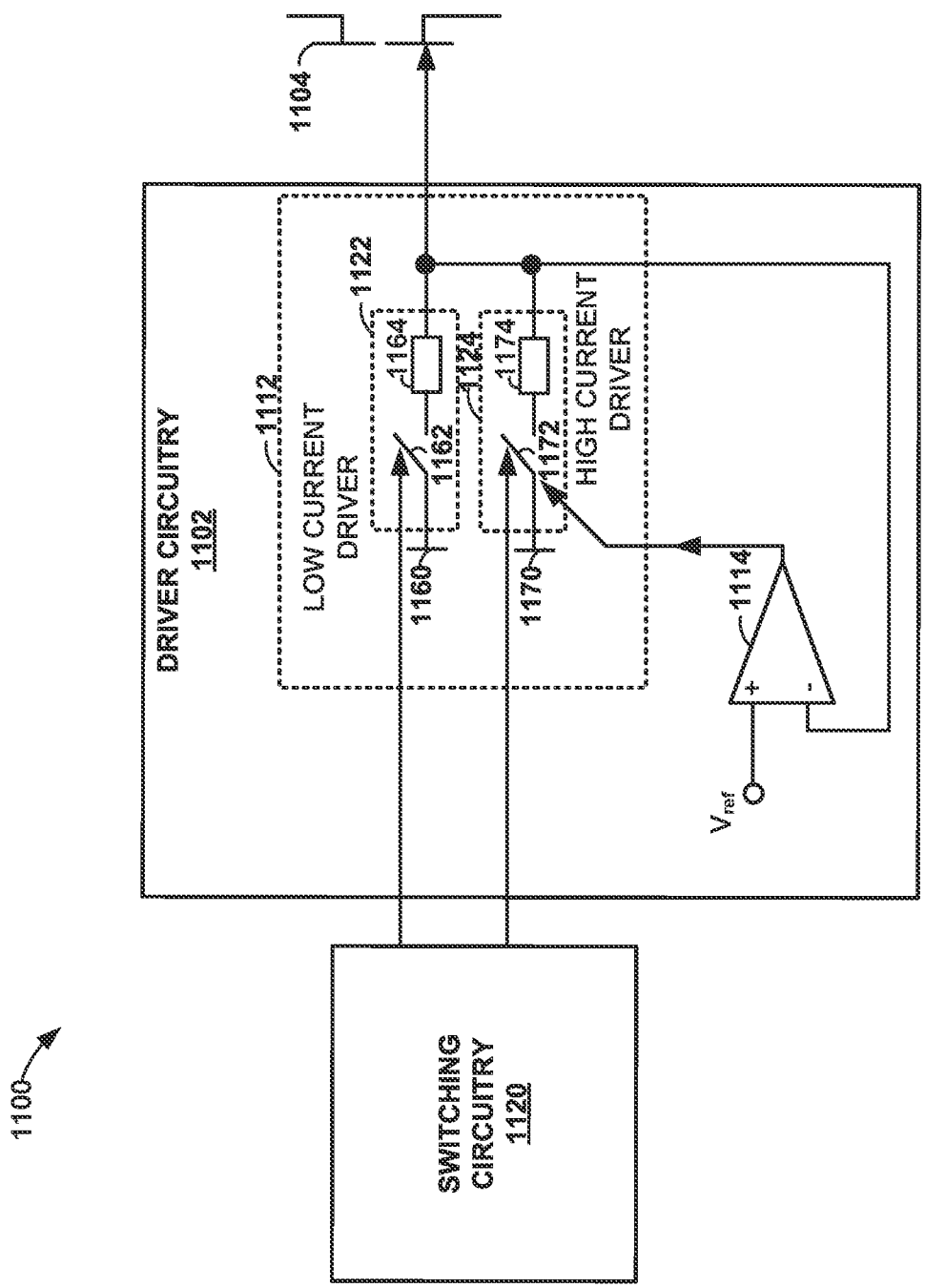
FIG. 11 is a block diagram illustrating an example system configured for controlling a current controlled switching element using a low-current driver circuit with a first second resistive component and a high-current driver circuit with a second resistive component, in accordance with one or more techniques of this disclosure.

FIG. 11 is a block diagram illustrating an example system 1100 configured for controlling a current controlled switching element 1104 using a low-current driver circuit 1122 with a first second resistive component 1164 and a high-current driver circuit 1124 with a second resistive component 1174, in accordance with one or more techniques of this disclosure. As shown in FIG. 11, system 1100 includes switching circuitry 1120, driver circuitry 1102, and current controlled switching element 1104. Driver circuitry 1102 may include driver circuitry 1112, which includes low-current driver circuit 1122 and high-current driver circuit 1124, and comparator 1114.

In the example of FIG. 11, low-current driver circuit 1122 includes a first switching element 1162 configured to electrically couple first resistive component 1164 to a supply voltage 1160. High-current driver circuit 1124 includes a second switching element 1172 configured to electrically couple second resistive component 1174 to supply voltage 1170, which may be the same supply voltage as supply voltage 1160. In some examples, first resistive component 1164 comprises a higher precision resistance than second resistive component 1174. For example, first resistive component 1164 may have a smaller resistance band around a target resistance than second resistive component 1174.

High-current driver circuit 1124 may include logic circuitry that drives second switching element 1172 based on both a switching signal output by switching circuitry 1120 and an output from comparator 1114. For example, high-current driver circuit 1124 may include an AND gate having a first input connected to the output of switching circuitry 1120, a second input connected to the output of comparator 1114, and an output connected to a control node (e.g., gate) of second switching element 1172. In this example, high-current driver circuit 1124 may initially operate second switching element 1172 in an on-state in response to the switching signal indicating to change from operating the current controlled switching element from the off-state to the on-state and while comparator 1114 detects that the voltage at the control node of current controlled switching element 1104 does not exceed the reference voltage. In this example, high-current driver circuit 1124 may then operate second switching element 1172 in an off-state in response to comparator 1114 detecting the voltage at the control node of current controlled switching element 1104 exceeds the reference voltage.

Figure 12:
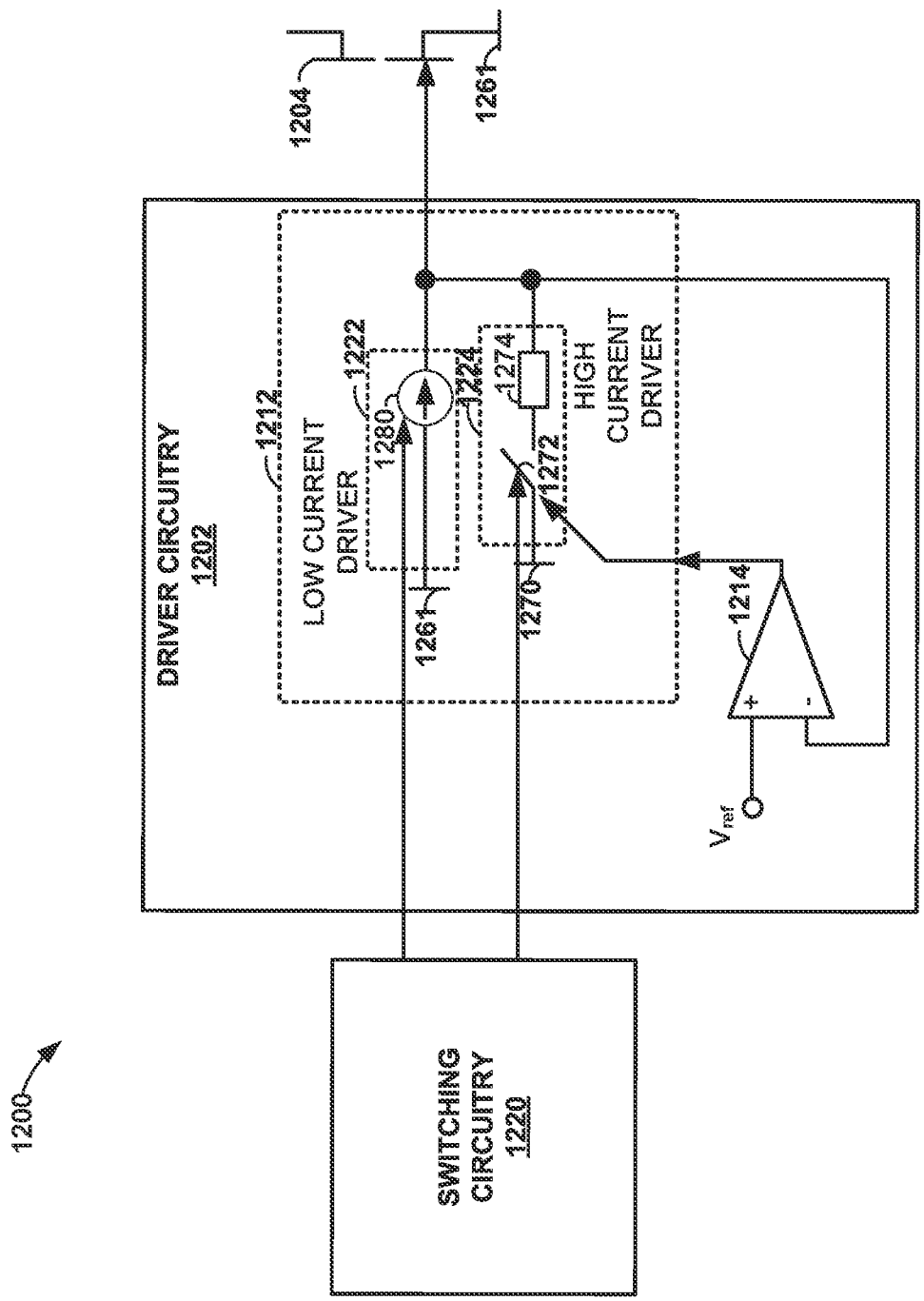
FIG. 12 is a block diagram illustrating an example system configured for controlling a current controlled switching element using a low-current driver circuit with a current source, in accordance with one or more techniques of this disclosure.

FIG. 12 is a block diagram illustrating an example system 1200 configured for controlling a current controlled switching element 1204 using a low-current driver circuit 1222 with a current source 1280, in accordance with one or more techniques of this disclosure. As shown in FIG. 12, system 1200 includes switching circuitry 1220, driver circuitry 1202, and current controlled switching element 1204. Driver circuitry 1202 may include driver circuitry 1212, which includes low-current driver circuit 1222 and high-current driver circuit 1224, and comparator 1214.

In the example of FIG. 12, low-current driver circuit 1222 includes current source 1280. Current source 1280 may be configured to generate the hold current. High-current driver circuit 1224 includes a second switching element 1272 configured to electrically couple second resistive component 1274 to supply voltage 1270.

Figure 13:
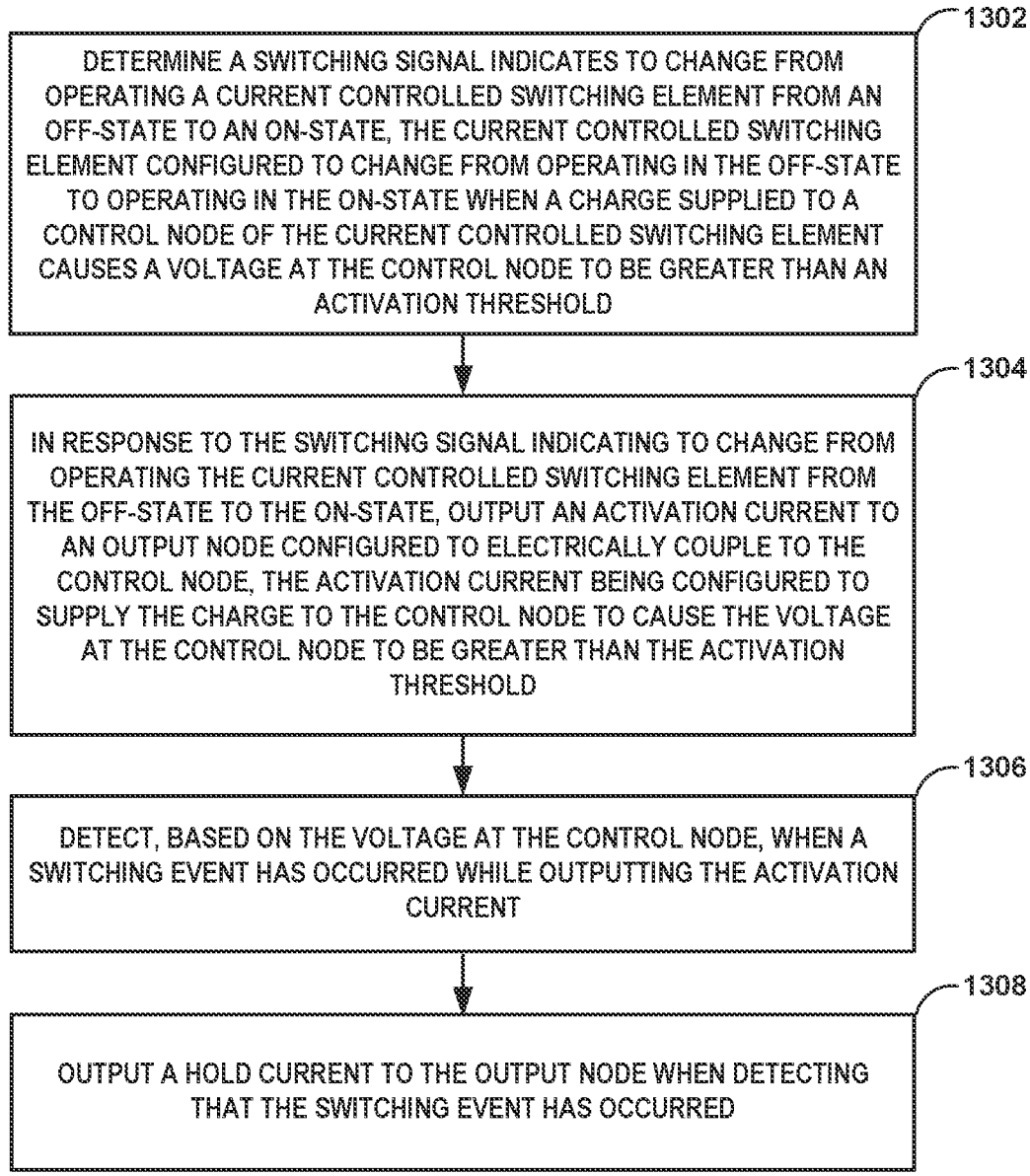
FIG. 13 is a flow diagram for controlling a current controlled switching element, in accordance with one or more techniques of this disclosure.

FIG. 13 is a flow diagram for controlling a current controlled switching element 104, in accordance with one or more techniques of this disclosure. FIG. 13 is discussed with respect to FIGS. 1-12 for example purposes only.

Driver circuitry 102, or more specifically, for example, current driver circuit 112, may determine a switching signal indicates to change from operating a current controlled switching element 104 from an off-state to an on-state. Current controlled switching element 104 may be configured to change from operating in the off-state to operating in the on-state when a charge supplied to a control node of the current controlled switching element causes a voltage at the control node to be greater than an activation threshold. For example, current controlled switching element 104 may include a gallium nitride (GaN) switching element. In some examples, current controlled switching element 104 includes a gate-injection-transistor (GIT) switching element.

Current driver circuit 112 may, in response to the switching signal indicating to change from operating the current controlled switching element from the off-state to the on-state, output an activation current to an output node configured to electrically couple to the control node. The activation current may be configured to supply the charge to the control node to cause the voltage at the control node to be greater than the activation threshold. For example, low-current driver circuit 422 may output the hold current to output node 406 while the switching signal indicates to operate current controlled switching element 404 in the on-state and high-current driver circuit 424 may output, for only a portion of a time when the switching signal indicates to operate the current controlled switching element in the on-state, a supplementary current to output node 406 that when combined with the hold current output by low-current driver circuit 422 forms the activation current. Low-current driver circuit 422 may include a resistive element and switching element (see FIG. 11). In some examples, low-current driver circuit 422 may include a current source (see FIG. 12). High-current driver circuit 424 may include a resistive element and switching element (see FIGS. 11, 12).

Detection circuitry 114 may detect, based on the voltage at control node 108, when a switching event has occurred while outputting the activation current. For example, detection circuitry 114 may detect that the switching event has occurred when the voltage at control node 108 exceeds a reference voltage.

Current driver circuit 112 may output a hold current to output node 106 when detecting that the switching event has occurred. For example, current driver circuit 112 may output a hold current to output node 106 in response to detecting that the switching event has occurred. The hold current may be sufficient to charge control node 108 to maintain the voltage at control node 108 to remain greater than the activation threshold.

In some examples, driver circuitry 102 may include timer circuitry. For example, timer circuitry 631 may initiate timer 630 in response to the switching cycle of a switching signal output by switching circuitry 620 indicating to change from operating current controlled switching element 604 from the off-state to the on-state. In this example, timer circuitry 631, or more specifically, for example, tristate logic 632 may output a signal based on the timer. For example, timer circuitry 631, or more specifically, for example, tristate logic 632 may determine, after the initiation of timer 630, whether detection circuitry 614 has detected the switching event and may output the signal when both the timer exceeds a threshold time value and detection circuitry 614 has not detected the switching event. Current driver circuit 612 may output the hold current to output node 606 when timer circuitry 631 outputs the signal. In some examples, driver circuitry 102 may include one or more of safety logic configured to output a safety signal when the timer circuitry outputs the signal (see FIG. 8), a voltage monitor configured to output an indication of the voltage at the control node to the safety logic (See FIG. 9), or an event counter (see FIG. 10).

The following clauses may illustrate one or more aspects of the disclosure.

Clause 1. A device for controlling a current controlled switching element, the device comprising: an output node configured to electrically couple to a control node of the current controlled switching element, the current controlled switching element configured to change from operating in an off-state to operating in an on-state when a charge supplied to the control node causes a voltage at the control node to be greater than an activation threshold; a current driver circuit configured to output an activation current to the output node in response to a switching signal indicating to change from operating the current controlled switching element from the off-state to the on-state, the activation current being configured to supply the charge to the control node to cause the voltage at the control node to be greater than the activation threshold; detection circuitry configured to detect, based on the voltage at the control node, when a switching event has occurred while the current driver circuit outputs the activation current; and wherein the current driver circuit is further configured to output a hold current to the output node when the detection circuitry has detected the switching event has occurred.

Clause 2. The device of clause 1, wherein the hold current is sufficient to charge the control node to maintain the voltage at the control node to remain greater than the activation threshold.

Clause 3. The device of clauses 1-2, wherein the detection circuitry is configured to detect that the switching event has occurred when the voltage at the control node exceeds a reference voltage.

Clause 4. The device of clauses 1-3, further comprising timer circuitry configured to: initiate a timer in response to the switching cycle of the switching signal indicating to change from operating the current controlled switching element from the off-state to the on-state; output a signal based on the timer; and wherein the current driver circuit is further configured to output the hold current when the timer circuitry outputs the signal.

Clause 5. The device of clause 4, wherein the timer circuitry is further configured to: determine, after the initiation of the timer, whether the detection circuitry has detected the switching event; and output the signal when both the timer exceeds a threshold time value and the detection circuitry has not detected the switching event.

Clause 6. The device of clauses 4-5, further comprising safety logic configured to output a safety signal when the timer circuitry outputs the signal.

Clause 7. The device of clause 6, further comprising: a voltage monitor configured to output an indication of the voltage at the control node to the safety logic; and wherein to output the safety signal, the safety logic is further configured to output the indication of the voltage at the control node.

Clause 8. The device of clause 7, wherein the voltage monitor is configured to generate the indication of the voltage at the control node as a peak of the voltage at the control node while the current driver circuit operates the current controlled switching element in the on-state.

Clause 9. The device of clauses 1-8, wherein the current driver circuit comprises: a low-current driver circuit configured to output the hold current to the output node while the switching signal indicates to operate the current controlled switching element in the on-state; and a high-current driver circuit configured to output, for only a portion of a time when the switching signal indicates to operate the current controlled switching element in the on-state, a supplementary current to the output node that when combined with the hold current output by the low-current driver circuit forms the activation current.

Clause 10. The device of clause 9, wherein the low-current driver circuit is further configured to stop the output of the hold current while the switching signal indicates to operate the current controlled switching element in the off-state.

Clause 11. The device of clauses 9-10, wherein the low-current driver circuit comprises a first switching element configured to electrically couple a first resistive component to a supply voltage; and wherein the high-current driver circuit comprises a second switching element configured to electrically couple a second resistive component to the supply voltage.

Clause 12. The device of clause 11, wherein the first resistive component comprises a higher precision resistance than the second resistive component.

Clause 13. The device of clauses 9-10, wherein the low-current driver circuit comprises a current source configured to generate the hold current.

Clause 14. The device of clauses 1-13, wherein the current controlled switching element comprises a gallium nitride (GaN) switching element.

Clause 15. The device of clauses 1-14, wherein the current controlled switching element comprises a gate-injection-transistor (GIT) switching element.

Clause 16. A method comprising: determining a switching signal indicates to change from operating a current controlled switching element from an off-state to an on-state, the current controlled switching element configured to change from operating in the off-state to operating in the on-state when a charge supplied to a control node of the current controlled switching element causes a voltage at the control node to be greater than an activation threshold; in response to the switching signal indicating to change from operating the current controlled switching element from the off-state to the on-state, outputting an activation current to an output node configured to electrically couple to the control node, the activation current being configured to supply the charge to the control node to cause the voltage at the control node to be greater than the activation threshold; detecting, based on the voltage at the control node, when a switching event has occurred while outputting the activation current; and outputting a hold current to the output node when detecting that the switching event has occurred.

Clause 17. A system comprising: a current controlled switching element configured to change from operating in an off-state to operating in an on-state when a charge supplied to a control node of the current controlled switching element causes a voltage at the control node to be greater than an activation threshold; and driver circuitry comprising: an output node configured to electrically couple to the control node of the current controlled switching element; a current driver circuit configured to output an activation current to the output node in response to a switching signal indicating to change from operating the current controlled switching element from the off-state to the on-state, the activation current being configured to supply the charge to the control node to cause the voltage at the control node to be greater than the activation threshold; detection circuitry configured to detect, based on the voltage at the control node, when a switching event has occurred while the current driver circuit outputs the activation current; and wherein the current driver circuit is further configured to output a hold current to the output node when the detection circuitry has detected the switching event has occurred.

Clause 18. The system of clause 17, wherein the hold current is sufficient to charge the control node to maintain the voltage at the control node to remain greater than the activation threshold.

Clause 19. The system of clauses 17-18, wherein the current controlled switching element comprises a gallium nitride (GaN) switching element.

Clause 20. The system of clauses 17-19, wherein the current controlled switching element comprises a gate-injection-transistor (GIT) switching element.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various aspects have been described in this disclosure. These and other aspects are within the scope of the following claims.

What is claimed is:

1. A device for controlling a current controlled switching element, the device comprising:

an output node configured to electrically couple to a control node of the current controlled switching element, the current controlled switching element configured to change from operating in an off-state to operating in an on-state when a charge supplied to the control node causes a voltage at the control node to be greater than an activation threshold;

a current driver circuit configured to output an activation current to the output node in response to a switching signal indicating to change from operating the current controlled switching element from the off-state to the on-state, the activation current being configured to supply the charge to the control node to cause the voltage at the control node to be greater than the activation threshold;

detection circuitry configured to detect, based on the voltage at the control node, when a switching event has occurred while the current driver circuit outputs the activation current; and wherein the current driver circuit is further configured to output a hold current to the output node when the detection circuitry has detected the switching event has occurred.

2. The device of claim 1, wherein the hold current is sufficient to charge the control node to maintain the voltage at the control node to remain greater than the activation threshold.

3. The device of claim 1, wherein the detection circuitry is configured to detect that the switching event has occurred when the voltage at the control node exceeds a reference voltage.

4. The device of claim 1, further comprising timer circuitry configured to:

initiate a timer in response to the switching cycle of the switching signal indicating to change from operating the current controlled switching element from the off-state to the on-state;

output a signal based on the timer; and wherein the current driver circuit is further configured to output the hold current when the timer circuitry outputs the signal.

5. The device of claim 4, wherein the timer circuitry is further configured to:

determine, after the initiation of the timer, whether the detection circuitry has detected the switching event; and output the signal when both the timer exceeds a threshold time value and the detection circuitry has not detected the switching event.

6. The device of claim 4, further comprising safety logic configured to output a safety signal when the timer circuitry outputs the signal.

7. The device of claim 6, further comprising:

a voltage monitor configured to output an indication of the voltage at the control node to the safety logic; and wherein to output the safety signal, the safety logic is further configured to output the indication of the voltage at the control node.

8. The device of claim 7, wherein the voltage monitor is configured to generate the indication of the voltage at the control node as a peak of the voltage at the control node while the current driver circuit operates the current controlled switching element in the on-state.

9. The device of claim 1, wherein the current driver circuit comprises:

a low-current driver circuit configured to output the hold current to the output node while the switching signal indicates to operate the current controlled switching element in the on-state; and a high-current driver circuit configured to output, for only a portion of a time when the switching signal indicates to operate the current controlled switching element in the on-state, a supplementary current to the output node that when combined with the hold current output by the low-current driver circuit forms the activation current.

10. The device of claim 9, wherein the low-current driver circuit is further configured to stop the output of the hold current while the switching signal indicates to operate the current controlled switching element in the off-state.

11. The device of claim 9, wherein the low-current driver circuit comprises a first switching element configured to electrically couple a first resistive component to a supply voltage; and wherein the high-current driver circuit comprises a second switching element configured to electrically couple a second resistive component to the supply voltage.

12. The device of claim 11, wherein the first resistive component comprises a higher precision resistance than the second resistive component.

13. The device of claim 9, wherein the low-current driver circuit comprises a current source configured to generate the hold current.

14. The device of claim 1, wherein the current controlled switching element comprises a gallium nitride (GaN) switching element.

15. The device of claim 1, wherein the current controlled switching element comprises a gate-injection-transistor (GIT) switching element.

16. A method comprising:

determining a switching signal indicates to change from operating a current controlled switching element from an off-state to an on-state, the current controlled switching element configured to change from operating in the off-state to operating in the on-state when a charge supplied to a control node of the current controlled switching element causes a voltage at the control node to be greater than an activation threshold;

in response to the switching signal indicating to change from operating the current controlled switching element from the off-state to the on-state, outputting an activation current to an output node configured to electrically couple to the control node, the activation current being configured to supply the charge to the control node to cause the voltage at the control node to be greater than the activation threshold;

detecting, based on the voltage at the control node, when a switching event has occurred while outputting the activation current; and outputting a hold current to the output node when detecting that the switching event has occurred.

17. A system comprising:

a current controlled switching element configured to change from operating in an off-state to operating in an on-state when a charge supplied to a control node of the current controlled switching element causes a voltage at the control node to be greater than an activation threshold; and driver circuitry comprising:

an output node configured to electrically couple to the control node of the current controlled switching element;

a current driver circuit configured to output an activation current to the output node in response to a switching signal indicating to change from operating the current controlled switching element from the off-state to the on-state, the activation current being configured to supply the charge to the control node to cause the voltage at the control node to be greater than the activation threshold;

detection circuitry configured to detect, based on the voltage at the control node, when a switching event has occurred while the current driver circuit outputs the activation current; and wherein the current driver circuit is further configured to output a hold current to the output node when the detection circuitry has detected the switching event has occurred.

18. The system of claim 17, wherein the hold current is sufficient to charge the control node to maintain the voltage at the control node to remain greater than the activation threshold.

19. The system of claim 17, wherein the current controlled switching element comprises a gallium nitride (GaN) switching element.

20. The system of claim 17, wherein the current controlled switching element comprises a gate-injection-transistor (GIT) switching element.

* * * * *